United States Patent
Tomimatsu

(10) Patent No.: US 11,137,821 B2
(45) Date of Patent: Oct. 5, 2021

(54) INFORMATION PROCESSING DEVICE, IMAGE FORMING APPARATUS, AND METHOD FOR CONTROLLING POWER SAVING

(71) Applicant: KYOCERA Document Solutions Inc., Osaka (JP)

(72) Inventor: Tetsuo Tomimatsu, Osaka (JP)

(73) Assignee: KYOCERA Document Solutions Inc., Osaka (JP)

( * ) Notice: Subject to any disclaimer, the term of this patent is extended or adjusted under 35 U.S.C. 154(b) by 0 days.

(21) Appl. No.: 16/907,444

(22) Filed: Jun. 22, 2020

(65) Prior Publication Data
US 2020/0409447 A1 Dec. 31, 2020

(30) Foreign Application Priority Data
Jun. 26, 2019 (JP) .............................. JP2019-119101

(51) Int. Cl.
*G06F 1/3287* (2019.01)
*G06F 13/40* (2006.01)
*G06F 3/12* (2006.01)
*G11C 11/406* (2006.01)

(52) U.S. Cl.
CPC .......... *G06F 1/3287* (2013.01); *G06F 3/1221* (2013.01); *G06F 3/1229* (2013.01); *G06F 13/4022* (2013.01); *G11C 11/40615* (2013.01)

(58) Field of Classification Search
CPC .. G06F 1/3287; G06F 13/4022; G06F 3/1229; G06F 3/1221; G06F 1/3284; G11C 11/40615; Y02D 10/00; G06K 15/4055
See application file for complete search history.

(56) References Cited

U.S. PATENT DOCUMENTS

| 4,287,563 A * | 9/1981 | Huston, Jr. | ........... G06F 13/387 |
| | | | 710/100 |
| 6,228,125 B1 * | 5/2001 | Kuriyama | ................. G06T 1/20 |
| | | | 382/234 |
| 6,918,018 B2 * | 7/2005 | Samuel | ................. G06F 9/3816 |
| | | | 365/220 |
| 9,015,506 B2 * | 4/2015 | Park | ................... G06K 15/4055 |
| | | | 713/320 |

(Continued)

FOREIGN PATENT DOCUMENTS

JP 2012232589 A 11/2012

*Primary Examiner* — Farley Abad
(74) *Attorney, Agent, or Firm* — Studebaker & Brackett PC

(57) ABSTRACT

An information processing device includes a first processor core of 2n-bits unit, a second processor core of n-bit(s) unit, a DRAM set including a first DRAM and a second DRAM of n-bit(s) unit, a first transmitting path between the first processor core and the DRAM set, a second transmitting path between the second processor core and the first or second DRAM, a transmitting path switching circuit, and a power supply controlling circuit. In normal operation, with switching to the first transmitting path and supplying power to the first processor core and the first and second DRAMs, the first processor core uses the first and second DRAMs. In power saving operation, with switching to the second transmitting path, supplying power to the second processor core and the first DRAM and stopping power to the first processor core and the second DRAM, the second processor core uses the first DRAM.

11 Claims, 5 Drawing Sheets

(56) References Cited

U.S. PATENT DOCUMENTS

| | | | | |
|---|---|---|---|---|
| 9,111,050 B2 * | 8/2015 | Macri | ................... | G06F 1/3293 |
| 9,451,112 B2 | 9/2016 | Park | | |
| 2009/0323120 A1 * | 12/2009 | Yamanaka | ......... | H04N 1/00885 |
| | | | | 358/1.16 |
| 2017/0010830 A1 * | 1/2017 | Ishikawa | ............. | G06F 12/0897 |

* cited by examiner

INFORMATION PROCESSING DEVICE, IMAGE FORMING APPARATUS, AND METHOD FOR CONTROLLING POWER SAVING

INCORPORATION BY REFERENCE

This application is based on and claims the benefit of priority from Japanese Patent application No. 2019-119101 filed on Jun. 26, 2019, the entire contents of which are incorporated herein by reference.

BACKGROUND

The present disclosure relates to an information processing device and an image forming apparatus respectively having power saving functions, and a method for controlling power saving in the information processing device.

Conventionally, there is an image forming apparatus including a main controller, a sub controller, a first memory and a second memory. In this image forming apparatus, in a normal mode, the main controller executes controlling operation of the image forming apparatus with using the first memory, and the sub controller executes an image forming job with using the second memory under controlling of the main controller. In a power saving mode, the sub controller executes standby processing and others with using the second memory. In the power saving mode, power supply to the main controller is turned off, and the first memory becomes a self-refresh state.

In recent years, in accordance with improvement of functions of the image forming apparatus, a microprocessor having high processing capacity tends to be installed into the image forming apparatus. On the other hand, power saving of the image forming apparatus is highly required. Because the microprocessor having high processing capacity needs large power consumption, the image forming apparatus including the microprocessor having high processing capacity has a problem of requiring further power saving.

By contrast, in the above-mentioned image forming apparatus, in the power saving mode, power supply to the main controller is turned off, but power is supplied to the first memory. As a result, it may be insufficient to reduce power consumption in the power saving mode.

Moreover, as a method of enhancing power saving effect, it is deemed to use a method of executing processing by the microprocessor having high processing capacity in the normal mode, but executing processing by a microprocessor having low processing capacity in the power saving mode. In addition, as a method of enhancing power saving effect, it is deemed that it is effective to use a common memory for such plural processors and to decrease the number of memories installed in the image forming apparatus in a case of totally considering power consumption in the normal mode and power consumption in the power saving mode.

By contrast, in the above-mentioned image forming apparatus, because it is configured that the main controller uses the first memory and the sub controller uses the second memory, and then, the memories are not used in common, it is difficult to enhance power saving effect.

SUMMARY

An information processing device of the present disclosure includes a first processor core, a second processor core, a DRAM set, a first transmitting path, a second transmitting path, a transmitting path switching circuit and a power supply controlling circuit. The first processor core inputs/outputs data in a unit of 2n bits (n is a natural number). The second processor core inputs/outputs data in a unit of n bit(s). The DRAM set includes a first DRAM allowing to input/output data in a unit of n bit(s) and a second DRAM allowing to input/output data in a unit of n bit(s). The first transmitting path connects the first processor core and the DRAM set and transmits data in a unit of 2n bits between the first processor core and the DRAM set. The second transmitting path connects the second processor core and the DRAM set, and selects any one out of data transmitting in a unit of n bit(s) between the second processor core and the first DRAM and data transmitting in a unit of n bit(s) between the second processor core and the second DRAM and carries out selected data transmitting. The transmitting path switching circuit switches a transmitting path connected to the DRAM set between the first transmitting path and the second transmitting path. The power supply controlling circuit controls power supply to the first processor core, the second processor core, the first DRAM and the second DRAM. In normal operation, in a state that the transmitting path switching circuit switches the transmitting path connected to the DRAM set to the first transmitting path and the power supply controlling circuit controls to supply power to the first processor core, the first DRAM and the second DRAM, the first processor core executes information processing by using the first DRAM and the second DRAM. In power saving operation, in a state that the transmitting path switching circuit switches the transmitting path connected to the DRAM set to the second transmitting path and the power supply controlling circuit controls to supply power to the second processor core and the first DRAM and to stop power supply to the first processor core and the second DRAM, the second processor core executes information processing by using the first DRAM.

An image forming apparatus of the present disclosure includes the above-described information processing device of the present disclosure A method for controlling power saving of the present disclosure is a method for controlling power saving in the information processing device including a first processor core, a second processor core, a DRAM set, a first transmitting path, a second transmitting path, a transmitting path switching circuit and a power supply controlling circuit. The first processor core inputs/outputs data in a unit of 2n bits (n is a natural number). The second processor core inputs/outputs data in a unit of n bit(s). The DRAM set includes a first DRAM allowing to input/output data in a unit of n bit(s) and a second DRAM allowing to input/output data in a unit of n bit(s). The first transmitting path connects the first processor core and the DRAM set and transmits data in a unit of 2n bits between the first processor core and the DRAM set. The second transmitting path connects the second processor core and the DRAM set, and selects any one out of data transmitting in a unit of n bit(s) between the second processor core and the first DRAM and data transmitting in a unit of n bit(s) between the second processor core and the second DRAM and carries out selected data transmitting. The transmitting path switching circuit switches a transmitting path connected to the DRAM set between the first transmitting path and the second transmitting path. The power supply controlling circuit controls power supply to the first processor core, the second processor core, the first DRAM and the second DRAM. Moreover, in the method for controlling power saving, in normal operation, in a state that the transmitting path switching circuit switches the transmitting path connected to the DRAM set to the first transmitting path and the power supply controlling circuit controls to supply power to the first processor core, the first DRAM and the second DRAM, the first processor core executes information processing by using the first DRAM and the second DRAM. Further, in the method for controlling power saving, in power saving operation, in a state that the transmitting path switching circuit switches the transmitting path connected to the DRAM set to the second transmitting path and the power supply controlling circuit controls to supply power to the second processor core and the first DRAM and to stop power supply to the first processor core and the second DRAM, the second processor core executes information processing by using the first DRAM.

The above and other objects, features, and advantages of the present disclosure will become more apparent from the following description when taken in conjunction with the accompanying drawings in which a preferred embodiment of the present disclosure is shown by way of illustrative example.

DETAILED DESCRIPTION

Information Processing Device

Figure 1:
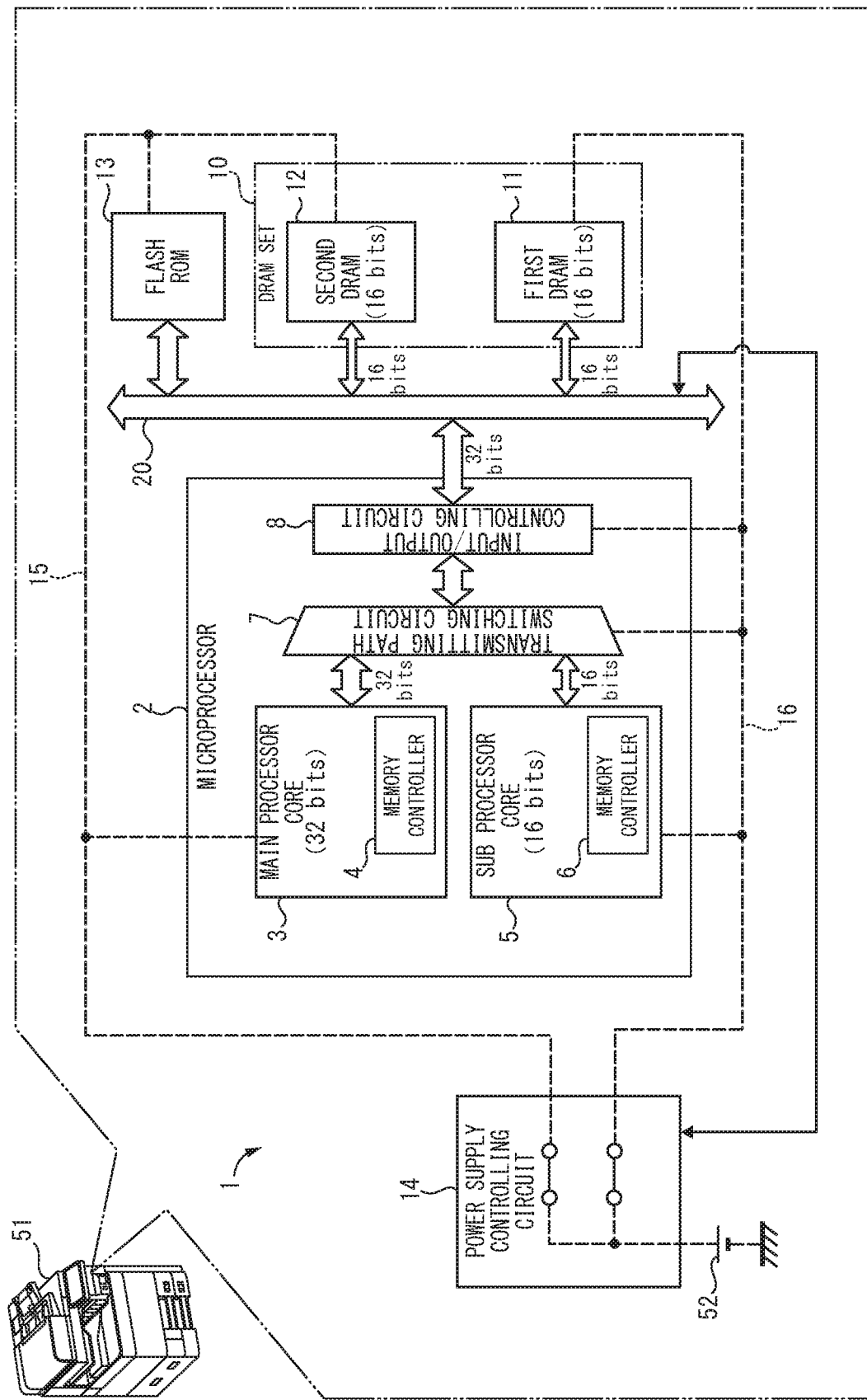
FIG. 1 is a circuit diagram showing an information processing device in a normal mode according to an embodiment of the present disclosure.

FIG. 1 shows an information processing device 1 according to an embodiment of the present disclosure. The information processing device 1 can be installed, for example, in an image forming apparatus 51 as a microprocessor controlling the image forming apparatus 51. The information processing device 1 includes, as shown in FIG. 1, a microprocessor 2, a first DRAM 11, a second DRAM 12, a flash ROM (read only memory) 13, a power supply controlling circuit 14 and a bus 20. Hereinafter, a combination of the first DRAM 11 and the second DRAM 12 is called as a "DRAM set" and reference numeral "10" is applied to this.

The microprocessor 2 is an ASIC (application specific integrated) or a SoC (system on chip) including a main processor core 3, a sub processor core 5, a transmitting path switching circuit 7 and an input/output controlling circuit 8. The main processor core 3 is a processor core capable of inputting/outputting data in a unit of 2n bits (n is a natural number), e.g., in a unit of 32 bits. In the main processor core 3, a memory controller 4 of 32 bits is installed. The sub processor core 5 is a processor core capable of inputting/outputting data in a unit of n bit(s), e.g., in a unit of 16 bits. In the sub processor core 5, a memory controller 6 of 16 bits is installed. The transmitting path switching circuit 7 is a circuit switching a transmitting path provided between the microprocessor 2 and the DRAM set 10 to a first transmitting path or a second transmitting path described later, and is composed of, for example, a multiplexer or the like. The input/output controlling circuit 8 is a circuit controlling input and output of data between the microprocessor 2 and the DRAM set 10.

The first DRAM 11 and the second DRAM 12 are respective DRAMs allowing to input/output data in a unit of n bit(s), e.g., in a unit of 16 bits. In the embodiment, as each of the first DRAM 11 and the second DRAM 12, for example, DDR3-SDRAM is applied. Each of the first DRAM 11 and the second DRAM 12 has a function carrying out self-refresh operation.

In the flash ROM 13, computer programs for making the main processor core 3 and the sub processor core 5 respective processing are stored.

The power supply controlling circuit 14 is an IC (integrated circuit) controlling power supply to the main processor core 3, the sub processor core 5, the transmitting path switching circuit 7, the input/output controlling circuit 8, the first DRAM 11, the second DRAM and the flash ROM 13. The power supply controlling circuit 14 is connected to, for example, a power source 52 of the image forming apparatus 51, in which the information processing device 1 is installed.

The bus 20 includes a data bus having a bus width of 2n bits, e.g., 32 bits. For data transmitting between the microprocessor 2 and the first DRAM 11, data transmitting between the microprocessor 2 and the second DRAM 12, and loading of program into the microprocessor 2 from the flash ROM 13, the bus 20 is used. Moreover, the power supply controlling circuit 14 is connected to the microprocessor 2 with using a part of the bus 20. Further, the main processor core 3 and the sub processor core 5 can transmit data with each other via an internal bus of the microprocessor.

Incidentally, the microprocessor 2 is a concrete example of a "processor" in claims, the main processor core 3 is a concrete example of a "first processor core" in claims, and the sub processor core 5 is a concrete example of a "second processor core" in claims.

Operation Mode

As an operation mode of the information processing device 1, there are a normal mode and a power saving mode. The normal mode is a mode for carrying out normal operation, and concretely, is the operation mode for carrying out main information processing in response to instruction inputting or the like from a user. The main information processing is, for example, printing, copying, facsimile sending/receiving and others in the image forming apparatus 51 in a case where the information processing device 1 is installed in the image forming apparatus 51. The power saving mode is a mode for carrying out power saving operation, and concretely, is a mode for carrying out only limited information processing while there is not instruction inputting or the like from the user. The limited information processing is, for example, standby processing or the like. Incidentally, the standby processing is processing of detecting whether or not there is instruction inputting or the like from the user.

For example, in a case where the information processing device 1 is installed in the image forming apparatus 51, at the beginning when power of the image forming apparatus 51 is turned on and the information processing device 1 starts to work, the microprocessor 2 sets the operation mode of the information processing device 1 to the normal mode. After that, when a predetermined time is elapsed without taking instruction inputting or the like from the user to the image forming apparatus 51, or when the user inputs instruction inputting of switching the operation mode of the information processing device 1 to the power saving mode into the image forming apparatus 51, the microprocessor 2 (e.g. the main processor core 3) switches the operation mode of the information processing device 1 from the normal mode to the power saving mode. After then, when taking instruction inputting or the like from the user to the image forming apparatus 51, the microprocessor 2 (e.g. the sub processor core 5) switches the operation mode of the information processing device 1 from the power saving mode to the normal mode.

Figure 2:
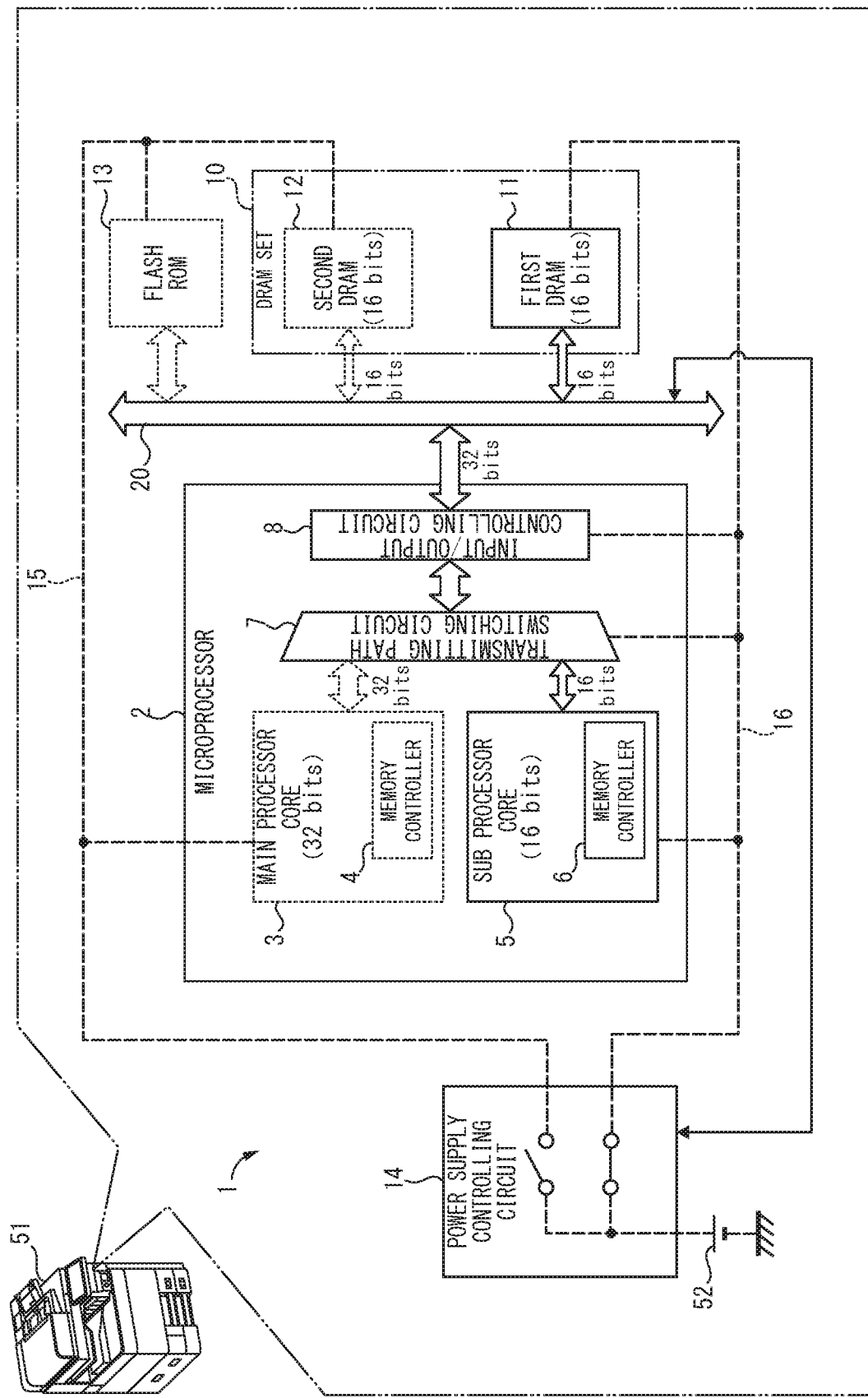
FIG. 2 is a circuit diagram showing the information processing device in a power saving mode according to the embodiment of the present disclosure.

FIG. 1 describes above shows a situation of power supply of the information processing device 1 in the normal mode. FIG. 2 shows a situation of power supply of the information processing device 1 in the power saving mode. In the normal mode, as shown in FIG. 1, by the power supply controlling circuit 14, power is supplied to the main processor core 3, the sub processor core 5, the transmitting path switching circuit 7 and the input/output controlling circuit 8, the first DRAM 11, the second DRAM 12 and the flash ROM 13, respectively. On the other hand, in the power saving mode, as shown in FIG. 2, by the power supply controlling circuit 14, power is supplied to the sub processor core 5, the transmitting path switching circuit 7 and the input/output controlling circuit 8 and the first DRAM 11, respectively, and power supply to each of the main processor core 3 and the second DRAM 12 is stopped. Incidentally, in FIG. 2, circuits, in which power supply is stopped, are illustrated by dot lines.

In the embodiment, such switching of power supply in accordance with changing of the operation mode of the information processing device 1 is carried out, for example, by the following method. That is, as shown in FIG. 1, the main processor core 3, the second DRAM 12 and the flash ROM 13 are connected to the power supply controlling circuit 14 by a first power supplying path 15. On the other hand, the sub processor core 5, the transmitting path switching circuit 7 and the input/output controlling circuit 8 and the first DRAM 11 are connected to the power supply controlling circuit 14 by a second power supplying path 16. The power supply controlling circuit 14 is controlled by the main processor core 3 or the sub processor core 5 to connect both the first power supplying path 15 and the second power supplying path 16 to the power source 52 in the normal mode, or to connect the second power supplying path 16 to the power source 52 and to disconnect the first power supplying path 15 from the power source 52 in the power saving mode.

Figure 3:
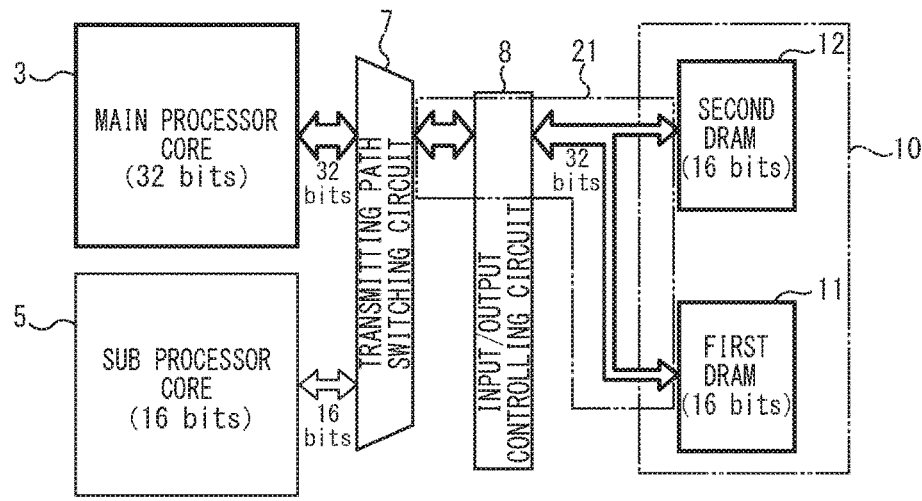
FIG. 3 is an explanatory drawing showing the information processing device, in a state that a first transmitting path is provided between a microprocessor and a DRAM set, according to the embodiment of the present disclosure.

Moreover, FIG. 3 illustrates a state that a first transmitting path 21 is provided between the microprocessor 2 and the DRAM set 10 of the information processing device 1. Further, FIGS. 4 and 5 respectively illustrate states that a second transmitting path 22 is provided between the microprocessor 2 and the DRAM set 10. Incidentally, in FIG. 4, circuits, in which power supply is stopped, are illustrated by dot lines.

In the normal mode, as shown in FIG. 3, the first transmitting path 21 is provided between the microprocessor 2 and the DRAM set 10. The first transmitting path 21 is a transmitting path allowing to transmit data in a unit of 2n bits, e.g., in a unit of 32 bits, between the main processor core 3 and the DRAM set 10. When the first transmitting path 21 is provided between the microprocessor 2 and the DRAM set 10, for example, an address bus or a data bus of low order 2n bits of the main processor core 3 is connected to the first DRAM 11, and an address bus or a data bus of high order 2n bits of the main processor core 3 is connected to the second DRAM 12. In such a situation, the main processor core 3 can use a memory space provided by connecting a memory space of the first DRAM 11 and a memory space of the second DRAM 12.

Figure 4:
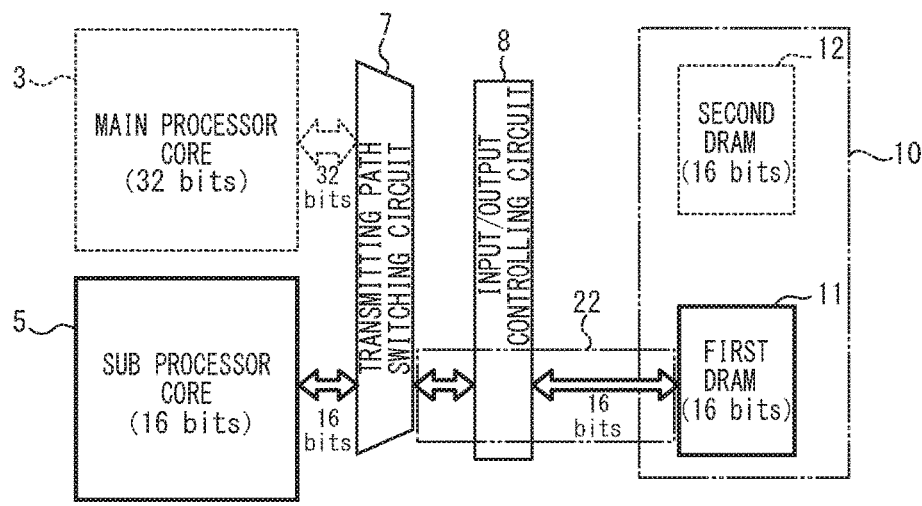
FIG. 4 is an explanatory drawing showing the information processing device, in a state that a second transmitting path is provided between the microprocessor and the DRAM set and that a first DRAM is selected, according to the embodiment of the present disclosure.
Figure 5:
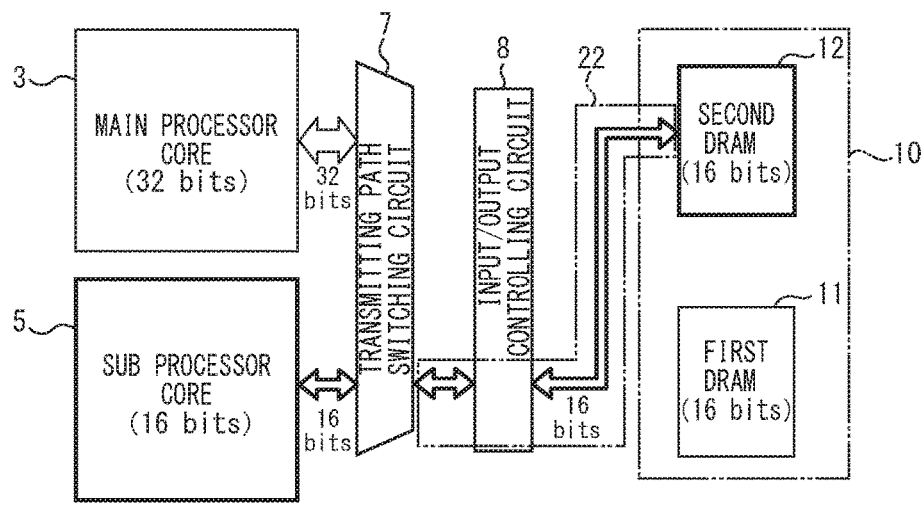
FIG. 5 is an explanatory drawing showing the information processing device, in a state that the second transmitting path is provided between the microprocessor and the DRAM set and that a second DRAM is selected, according to the embodiment of the present disclosure.

On the other hand, in the power saving mode, as shown in FIGS. 4 and 5, the second transmitting path 22 is provided between the microprocessor 2 and the DRAM set 10. The second transmitting path 22 is a transmitting path allowing to select any one out of data transmitting in a unit of n bit(s), e.g., in a unit of 16 bits, between the sub processor core 5 and the first DRAM 11 (refer to FIG. 4) and data transmitting in a unit of n bit(s), e.g., in a unit of 16 bits, between the sub processor core 5 and the second DRAM 12 (refer to FIG. 5) and to carry out selected data transmitting. The sub processor core 5 can output respective selecting signals to the first DRAM 11 and the second DRAM 12 to select data transmitting between the sub processor core 5 and the first DRAM 11 or data transmitting between the sub processor core 5 and the second DRAM 12.

The first transmitting path 21 and the second transmitting path 22 are provided on an internal bus of the microprocessor 2 and on the bus 20 connecting the first DRAM 11 and the second DRAM 12 and the microprocessor 2 by the transmitting path switching circuit 7. the transmitting path switching circuit 7 is controlled by the main processor core 3 or the sub processor core 5 to switch the transmitting path connecting the microprocessor 2 and the DRAM set 10 to the first transmitting path 21 in the normal mode, or to switch the transmitting path connecting the microprocessor 2 and the DRAM set 10 to the second transmitting path 22 in the power saving mode.

Incidentally, the first transmitting path 21 is a concrete example of a "first transmitting path" in claims, and the second transmitting path 22 is a concrete example of a "second transmitting path" in claims.

Power Saving Controlling Program

Figure 6A:
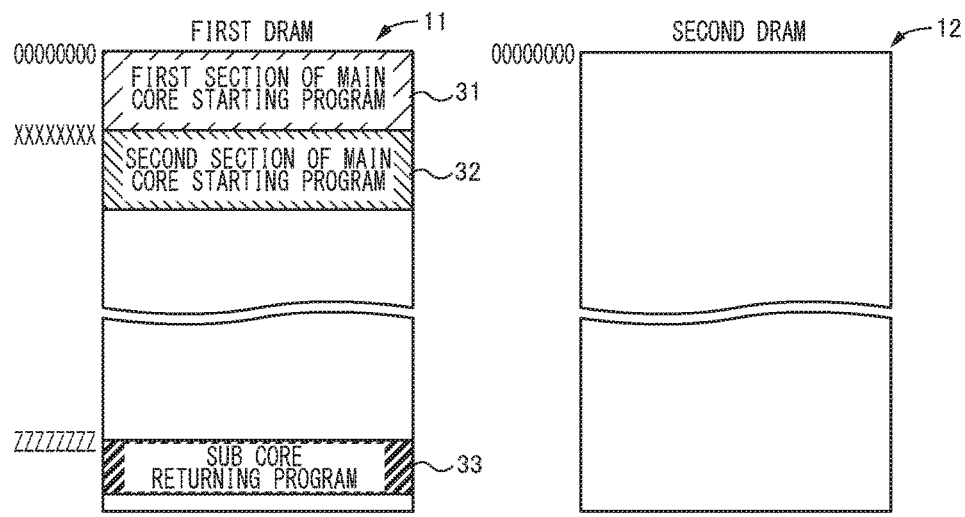
FIGS. 6A, 6B and 6C are explanatory drawings showing arrangement of programs in the first DRAM and the second DRAM in the information processing device according to the embodiment of the present disclosure.

FIG. 6A illustrates arrangement of programs in the first DRAM 11 and the second DRAM 12 before shift from the normal mode to the power saving mode is started.

In the first DRAM 11, when the information processing device 1 is started, a first section 31 of a main core starting program, a second section 32 of the main core starting program, and a sub core returning program 33 are written. The main core starting program is a program for starting the main processor core 3 when shifting from the power saving mode to the normal mode. The main core starting program is divided into the first section 31 and the second section 32. The sub core returning program 33 is a program for making the sub processor core 5 execute shift processing from the power saving mode to the normal mode.

The first section 31 of the main core starting program is written from a leading address of the first DRAM 11. The second section 32 of the main core starting program is written into an area other than an area storing the first section 31 of the main core starting program in the first DRAM 11. For example, the second section 32 of the main core starting program is written, as shown in FIG. 6A, in the area continuing from the area storing the first section 31 of the main core starting program and starting from an address "XXXXXXXX" in the first DRAM 11. Moreover, the sub core returning program 33 is written into the area (an area starting from an address "ZZZZZZZZ") other than the respective areas storing the first section 31 and the second section 32 of the main core starting program in the first DRAM 11.

The first section 31 of the main core starting program, the second section 32 of the main core starting program and the sub core returning program 33 written in the first DRAM 11 when starting the information processing device 1 are held in the first DRAM 11 until power of the information processing device 1 is completely turned off. That is, these programs are held in the first DRAM 11 in the normal mode or in the power saving mode. As a result, arrangement of programs in the first DRAM 11 and the second DRAM 12 before shift from the normal mode to the power saving mode is started becomes arrangement shown in FIG. 6A.

Incidentally, in the first DRAM 11, an area other than the area storing the first section 31 of the main core starting program, the area storing the second section 32 of the main core starting program and the area storing the sub core starting program 33, and an area in the second DRAM 12 are used when the main processor core 3 executes information processing in the normal mode.

Figure 6B:
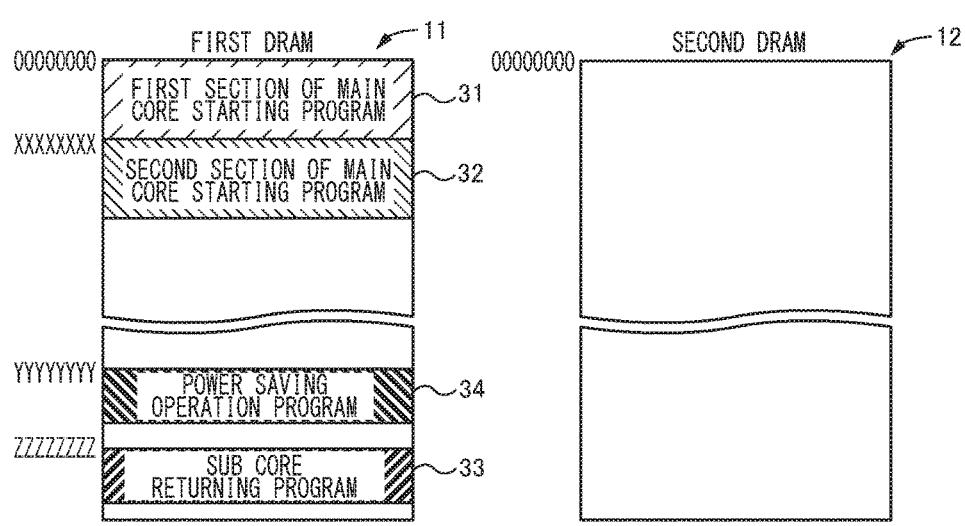

FIG. 6B illustrates arrangement of programs in the first DRAM 11 and the second DRAM 12 immediately after shift from the normal mode to the power saving mode is started. As shown in FIG. 6B, immediately after shift from the normal mode to the power saving mode is started, a power saving operation program 34 stored in the flash ROM 13 is written into the first DRAM 11 under controlling of the sub processor core 5. The power saving operation program 34 is a program for making the sub processor core 5 execute power saving operation. The power saving operation program 34 is stored in the area (an area starting from an address "YYYYYYYY") other than the area storing the first section 31 of the main core starting program, the area storing the second section 32 of the main core starting program and the area storing the sub core starting program 33 in the first DRAM 11.

Figure 6C:
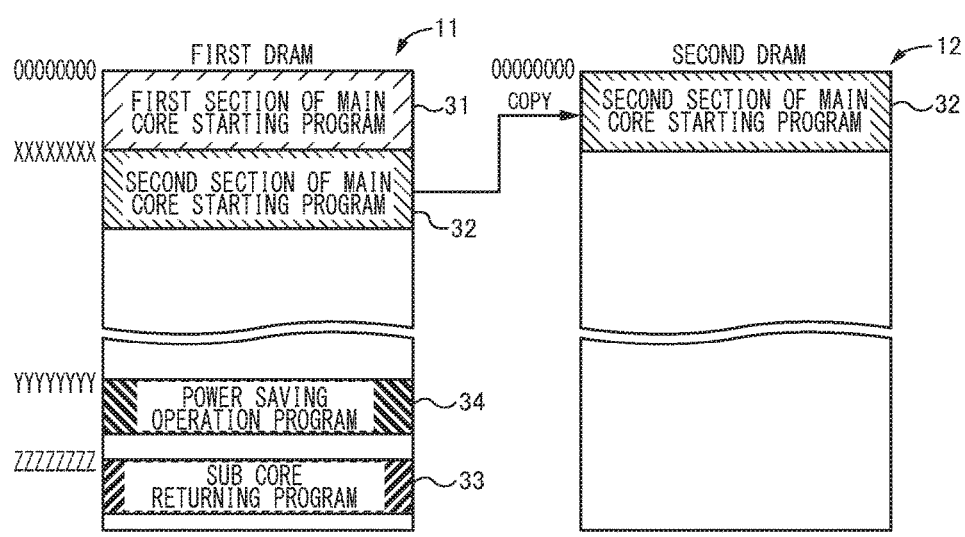

FIG. 6C illustrates arrangement of programs in the first DRAM 11 and the second DRAM 12 when shifting from the power saving mode to the normal mode. As shown in FIG. 6C, when shifting from the power saving mode to the normal mode, a copy of the second section 32 of the main core controlling program stored in the first DRAM 11 is written into the second DRAM 12 under controlling of the sub processor core 5. The copy of the second section 32 of the main core controlling program is written from a leading address of the second DRAM 12.

The main core starting program is read in a unit of 32 bits via the first transmitting path 21 by the main processor core 3, in a state that the first section 31 is stored from a leading address of the first DRAM 11 and the second section 32 is stored from a leading address of the second DRAM 12, to function as a program for starting the main processor core 3.

Flow of Power Saving Controlling

Figure 7:
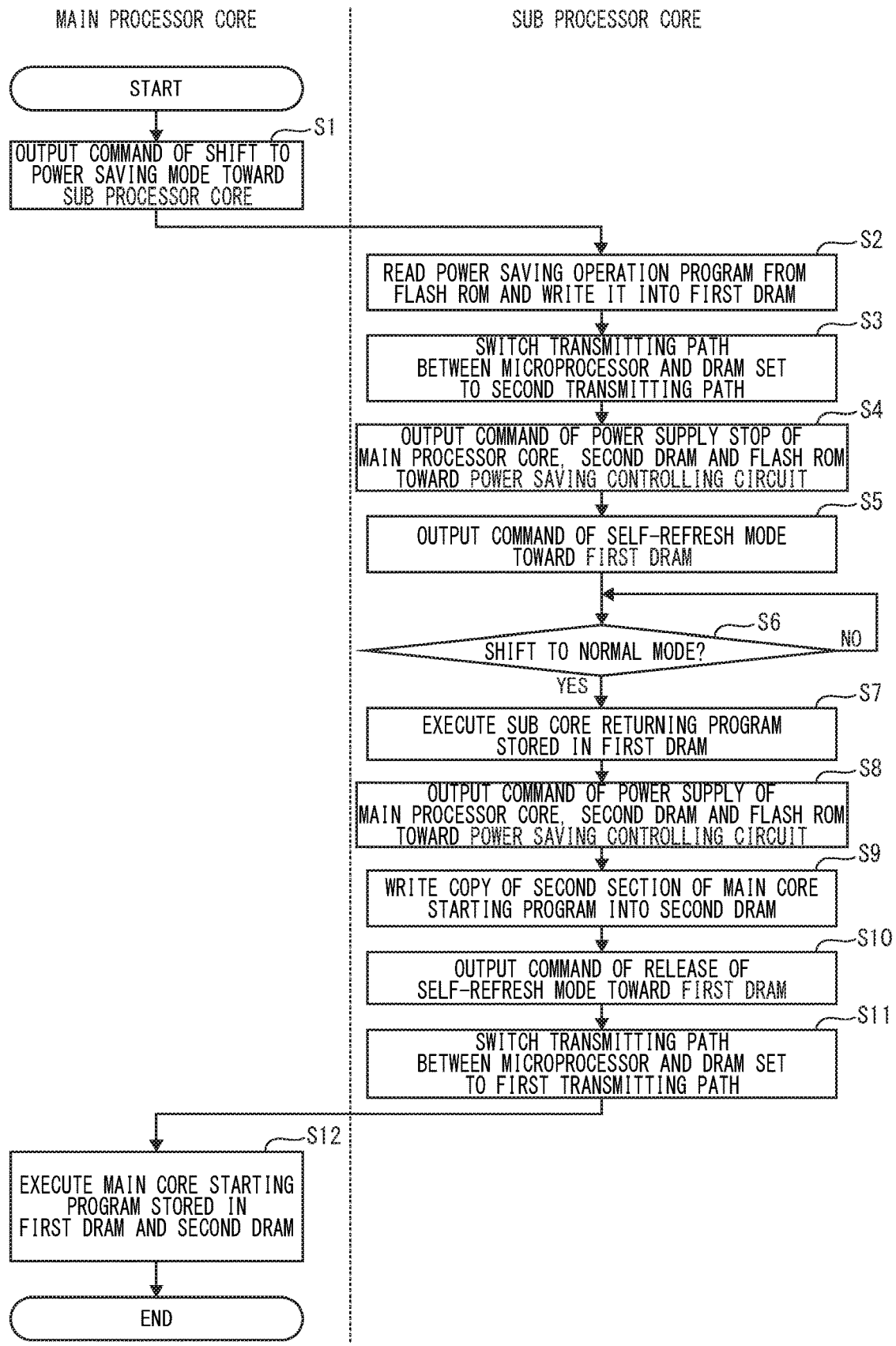
FIG. 7 is a flow chart showing power saving controlling in the information processing device according to the embodiment of the present disclosure.

FIG. 7 illustrates a flow of power saving controlling in the information processing device 1. When the predetermined time is elapsed without taking instruction inputting or the like from the user to the image forming apparatus 51, or when the user inputs instruction inputting of switching the operation mode of the information processing device 1 to the power saving mode into the image forming apparatus 51, as described above, while the operation mode of the information processing device 1 is the normal mode, processing of shifting the operation mode of the information processing device 1 from the normal mode to the power saving mode is started. In such shifting processing, first, the main processor core 3 outputs a command to shift from the normal mode to the power saving mode toward the sub processor core 5 (step S1 in FIG. 7).

According to this, the sub processor core 5 reads out the power saving operation program 34 from the flash ROM 13 and writes the power saving operation program 34 into the first DRAM 11 (step S2). As a result, a state inside the first DRAM 11 becomes from a state of FIG. 6A to a state of FIG. 6B.

Next, the sub processor core 5 executes the power saving operation program 34 written in the first DRAM 11 to execute processing from step S3 to step S6. That is, the sub processor core 5 firstly controls the transmitting path switching circuit 7 to switch the transmitting path between the microprocessor 2 and the DRAM set 10 to the second transmitting path 22 (step S3). And then, the sub processor core 5 outputs a selecting signal indicating selection of the first DRAM 11 toward the first DRAM 11 and a selecting signal indicating non-selection of the second DRAM 12 toward the second DRAM 12 so as to transmit data between the sub processor core 5 and the first DRAM 11. As a result, between the microprocessor 2 and the DRAM set 10, the second transmitting path 22 shown in FIG. 4 is provided.

Subsequently, the sub processor core 5 outputs a command to stop respective power supply to the main processor core 3, the second DRAM 12 and the flash ROM 13 toward the power supply controlling circuit 14 (step S4). The power supply controlling circuit 14 stops respective power supply to the main processor core 3, the second DRAM 12 and the flash ROM 13 in accordance with this command. Incidentally, respective power supply to the sub processor core 5, the transmitting path switching circuit 7, the input/output controlling circuit 8 and the first DRAM 11 is continued (refer FIG. 2).

Next, the sub processor core 5 outputs a command to set a self-fresh mode to the first DRAM 11 toward the first DRAM 11 (step S5). The first DRAM 11 switches its own operation mode to the self-fresh mode in accordance with this command.

Subsequently, the sub processor core 5 executes standby processing in accordance with the power saving operation program 34 stores in the first DRAM 11.

When the sub processor core 5 detects instruction inputting or the like from the user to the image forming apparatus 51 during standby processing, the sub processor core 5 starts shift processing of the operation of the information processing device 1 from the power saving mode to the normal mode (step S6: YES). In this shift processing, the sub processor core 5 firstly executes the sub core returning program 33 previously stored in the first DRAM 11 (step S7).

The sub processor core 5 executes processing from step S8 to step S11 in accordance with the sub core returning program 33. That is, the sub processor core 5 firstly outputs a command to supply respective power to the main processor core 3, the second DRAM 12 and the flash ROM 13, in addition to the sub processor core 5, the transmitting path switching circuit 7, the input/output controlling circuit 8 and the first DRAM 11 toward the power supply controlling circuit 14 (step S8). The power supply controlling circuit 14 supplies respective power to the main processor core 3, the second DRAM 12 and the flash ROM 13 in accordance with this command. Incidentally, power supply to the sub processor core 5, the transmitting path switching circuit 7, the input/output controlling circuit 8 and the first DRAM 11 is continued (refer to FIG. 1).

Next, the sub processor core 5 writes a copy of the second section 32 of the main core controlling program previously stored in the first DRAM 11 into the second DRAM (step S9). Concretely, in step S9, the sub processor core 5 firstly, read the second section 32 of the main core controlling program from the first DRAM 11 and stores the second section 32 in a cash installed in the sub processor core 5. And then, the sub processor core 5 outputs a selecting signal indicating selection of the second DRAM 12 toward the second DRAM 12 and a selecting signal indicating non-selection of the first DRAM 11 toward the first DRAM 11 so as to transmit data between the sub processor core 5 and the second DRAM 12. As a result, between the microprocessor 2 and the DRAM set 10, the second transmitting path 22 shown in FIG. 5 is provided. Further, the sub processor core 5 writes the second section 32 of the main core starting program stored in the cash installed in the sub processor core 5 into the second DRAM 12. As a result, a state inside the second DRAM 12 becomes a state of FIG. 6C.

Subsequently, the sub processor core 5 outputs a command to release the self-refresh mode of the first DRAM 11 toward the first DRAM 11 (step S10). The first DRAM 11 releases the self-refresh mode in accordance with this command.

Next, the sub processor core 5 controls the transmitting path switching circuit 7 to switch the transmitting path between the microprocessor 2 and the DRAM set 10 to the first transmitting path 21 (step S11). As a result, between the microprocessor 2 and the DRAM set 10, the first transmitting path 21 shown in FIG. 3 is provided.

Subsequently, the main processor core 3 executes the main core starting program composed of the first section 31 of the main core starting program stored in the first DRAM 11 and the second section 32 of the main core starting program stored in the second DRAM 12 to start itself (step S12).

As described above, in the information processing device 1 according to the embodiment of the present disclosure, in the power saving mode, power supply to the second DRAM 12, in addition to the main processor core 3 and the flash ROM 13, is stopped. By such a configuration, it is possible to further reduce power consumption.

Moreover, in the information processing device 1 according to the embodiment of the present disclosure, normal operation is executed by the main processor core 3 of 2n bits having high processing capacity, but power saving operation is executed by the sub processor core 5 of n bit(s) having low processing capacity. The sub processor core 3 of n bit(s) requires less power consumption in operation in comparison with the main processor core 3 of 2n bits. Therefore, in accordance with such a configuration of the embodiment, it is possible to reduce power consumption in power saving operation in comparison with a case where the main processor core 3 of 2n bits having high processing capacity executes not only the normal operation but also the power saving operation. Accordingly, even if a processor core having high processing capacity is installed, it is possible to enhance power saving effect.

Further, in the information processing device 1 according to the embodiment of the present disclosure, the first DRAM 11 is used by the main processor core 3 in the normal mode, but is used by the sub processor core 5 in the power saving mode. Thus, since the common memory is used by the plural processor cores in the normal mode and the power saving mode, it is possible to decrease the number of memories provided in the information processing device 1. Accordingly, by decreasing the memories, it is possible to reduce power consumption.

Furthermore, in the information processing device 1 according to the embodiment of the present disclosure, information processing in the normal mode is executed in a unit of 2n bits by using the first DRAM 11 and the second DRAM 12, but information processing in the power saving mode is executed in a unit of n bit(s) by using only the first DRAM 11. Moreover, in the normal mode, the transmitting path between the microprocessor 2 and the DRAM set 10 is switched to the first transmitting path 21 to execute data transmitting in a unit of 2n bits, but in the power saving mode, the transmitting path between the microprocessor 2 and the DRAM set 10 is switched to the second transmitting path 22 to execute data transmitting in a unit of n bit(s). Thus, in accordance with the embodiment, it is possible to execute high speed processing of 2n bits and low speed processing of n bit(s) by using a common hardware resource. Therefore, it is possible to decrease the number of components of the information processing device 1 and to reduce manufacturing cost of the information processing device 1.

Moreover, in the information processing device 1 according to the embodiment of the present disclosure, in the power saving mode, the operation mode of the first DRAM is set to the self-refresh mode. Thereby, it is possible to reduce consumption in the power saving mode.

Incidentally, the above-described embodiment cites a case where the number of bits of the main processor core 3 and the first transmitting path 21 are 32 bits, and the number of bits of the sub processor core 5, the first DRAM 11, the second DRAM 12 and the second transmitting path 22 are 16 bits. However, the number of bits of the main processor core 3 and the first transmitting path 21 may be 16 bits, 64 bits or more, and the number of bits of the sub processor core 5, the first DRAM 11, the second DRAM 12 and the second transmitting path 22 may be 8 bits, 32 bits or more.

Moreover, although the above-described embodiment cites a case where each of the main processor core 3 and the sub processor core 5 uses two DRAMs 11 and 12, the number of DRAMs used by the main processor core 3 and the sub processor core 5 may be further increased. In addition, the number of processor cores in the microprocessor 2 may be increased.

Further, although the above-described embodiment cites a case where the information processing device 1 is installed in the image forming apparatus 51, the information processing device 1 of the present disclosure may be applied into the other device, and main information processing executed in the information processing device 1 is not limited by image forming.

Moreover, the present disclosure may be suitably varied within range not contrary to summary or idea of the disclosure been readable from the claims and the whole of the specification, and an information processing device, an image forming apparatus and a method for controlling power saving having such variation is also included in technical idea of the disclosure.

The invention claimed is:

1. An information processing device comprising:
a first processor core capable of inputting/outputting data in a unit of 2n bits, n is a natural number;
a second processor core capable of inputting/outputting data in a unit of n bit(s);
a DRAM set including a first DRAM allowing to input/output data in a unit of n bit(s) and a second DRAM allowing to input/output data in a unit of n bit(s);
a first transmitting path connecting the first processor core and the DRAM set and allowing to transmit data in a unit of 2n bits between the first processor core and the DRAM set;
a second transmitting path connecting the second processor core and the DRAM set and allowing to select any one out of:
data transmitting in a unit of n bit(s) between the second processor core and the first DRAM; and
data transmitting in a unit of n bit(s) between the second processor core and the second DRAM; and
to carry out selected data transmitting;
a transmitting path switching circuit switching a transmitting path connected to the DRAM set between the first transmitting path and the second transmitting path; and
a power supply controlling circuit controlling power supply to the first processor core, the second processor core, the first DRAM and the second DRAM,
wherein, in normal operation, in a state that the transmitting path switching circuit switches the transmitting path connected to the DRAM set to the first transmitting path and the power supply controlling circuit controls to supply power to the first processor core, the first DRAM and the second DRAM, the first processor core executes information processing by using the first DRAM and the second DRAM,
in power saving operation, in a state that the transmitting path switching circuit switches the transmitting path connected to the DRAM set to the second transmitting path and the power supply controlling circuit controls to supply power to the second processor core and the first DRAM and to stop power supply to the first processor core and the second DRAM, the second processor core executes information processing by using the first DRAM.

2. The information processing device according to claim 1, wherein
in the first DRAM, a first section of a starting program for starting the first processor core when shifting the power saving operation to the normal operation and a second section of the starting program are stored,
when shifting the power saving operation to the normal operation,
the second processor core controls the power supply controlling circuit to supply power to the first processor core, the second processor core, the first DRAM and the second DRAM, and then, writes the second section of the starting program stored in the first DRAM into the second DRAM, and then, controls the transmitting path switching circuit to switch the transmitting path connected to the DRAM set from the second transmitting path to the first transmitting path,
after the transmitting path connected to the DRAM set is switched to the first transmitting path by the second processor core, starting the first processor core by using the first section of the starting program stored in the first DRAM and the second section of the starting program stored in the second DRAM by the second processor core.

3. The information processing device according to claim 2, wherein
the second processor core writes the second section of the starting program into the second DRAM, and then, outputs a command to release a self-refresh mode of the first DRAM towards the first DRAM, and the first DRAM releases self-refresh mode in accordance with this command.

4. The information processing device according to claim 2, wherein
in the first DRAM, a predetermined sub core returning program is previously stored,
when shifting from the power saving operation to the normal operation, the second processor core executes the sub core returning program stored in the first DRAM.

5. The information processing device according to claim 1, wherein
when shifting from the normal operation to the power saving operation, the second processor core controls the transmitting path switching circuit to switch the transmitting path connected to the DRAM set from the first transmitting path to the second transmitting path, controls the power supply controlling circuit to supply power to the second processor core and the first DRAM and to stop power supply to the first processor core and the second DRAM, and switches operation mode of the first DRAM to a self-refresh mode.

6. The information processing device according to claim 5, further comprising:
a flash ROM, in which a predetermined power saving operation program is stored,
wherein when shifting from the normal operation to the power saving operation, the second processor core reads out the predetermined power saving operation program from the flash ROM and writes the predetermined power saving operation program into the first DRAM, and then, executes the predetermined power saving operation program stored in the first DRAM.

7. The information processing device according to claim 1, further comprising:
a processor including the first processor core and the second processor core,
wherein the processor and the DRAM set are connected by a bus having a bus width of 2n bits,
the first transmitting path and the second transmitting path are provided by the bus.

8. An image forming apparatus comprising:
the information processing device according to claim 1.

9. A method for controlling power saving in an information processing device including:
a first processor core capable of inputting/outputting data in a unit of 2n bits, n is a natural number;
a second processor core capable of inputting/outputting data in a unit of n bit(s); and
a DRAM set including a first DRAM allowing to input/output data in a unit of n bit(s) and a second DRAM allowing to input/output data in a unit of n bit(s),
the method comprising:
transmitting data in a unit of 2n bits between the first processor core and the DRAM set by a first transmitting path connecting the first processor core and the DRAM set;

selecting any one out of:
  data transmitting in a unit of n bit(s) between the second processor core and the first DRAM; and
  data transmitting in a unit of n bit(s) between the second processor core and the second DRAM; and
carrying out selected data transmitting by a second transmitting path connecting the second processor core and the DRAM set;
switching a transmitting path connected to the DRAM set between the first transmitting path and the second transmitting path by a transmitting path switching circuit provided in the information processing device; and
controlling power supply to the first processor core, the second processor core, the first DRAM and the second DRAM by a power supply controlling circuit provided in the information processing device,
the method further comprising:
in normal operation, in a state that the transmitting path switching circuit switches the transmitting path connected to the DRAM set to the first transmitting path and the power supply controlling circuit controls to supply power to the first processor core, the first DRAM and the second DRAM, executing information processing by using the first DRAM and the second DRAM by the first processor core,
in power saving operation, in a state that the transmitting path switching circuit switches the transmitting path connected to the DRAM set to the second transmitting path and the power supply controlling circuit controls to supply power to the second processor core and the first DRAM and to stop power supply to the first processor core and the second DRAM, executing information processing by using the first DRAM by the second processor core.

10. The method for controlling power saving according to claim 9, further comprising:
  in the first DRAM, storing a first section of a starting program for starting the first processor core when shifting the power saving operation to the normal operation and a second section of the starting program; and
  when shifting the power saving operation to the normal operation,
  controlling the power supply controlling circuit by the second processor core to supply power to the first processor core, the second processor core, the first DRAM and the second DRAM, and then, writing the second section of the starting program stored in the first DRAM into the second DRAM by the second processor core, and then, controlling the transmitting path switching circuit by the second processor core to switch the transmitting path connected to the DRAM set from the second transmitting path to the first transmitting path; and
  after the transmitting path connected to the DRAM set is switched to the first transmitting path by the second processor core, starting the first processor core by using the first section of the starting program stored in the first DRAM and the second section of the starting program stored in the second DRAM by the second processor core.

11. The method for controlling power saving according to claim 9, further comprising:
  when shifting from the normal operation to the power saving operation, controlling the transmitting path switching circuit by the second processor core to switch the transmitting path connected to the DRAM set from the first transmitting path to the second transmitting path, controlling the power supply controlling circuit by the second processor core to supply power to the second processor core and the first DRAM and to stop power supply to the first processor core and the second DRAM, and switching operation mode of the first DRAM to a self-refresh mode by the second processor core.

* * * * *